(12) United States Patent
Furlong et al.

(10) Patent No.: US 8,186,414 B2
(45) Date of Patent: May 29, 2012

(54) METHOD FOR FORMING AN OBJECT

(75) Inventors: Michael Thomas Furlong, Leicestershire (GB); Neil Hopkinson, Nottingham (GB); Kamran Aamir Mumtaz, Harrow Weald (GB)

(73) Assignee: Loughborough University, Loughborough, Leicestershire (GB)

( * ) Notice: Subject to any disclaimer, the term of this patent is extended or adjusted under 35 U.S.C. 154(b) by 125 days.

(21) Appl. No.: 12/583,518

(22) Filed: Aug. 21, 2009

(65) Prior Publication Data
US 2011/0042031 A1 Feb. 24, 2011

(51) Int. Cl.
*B22D 46/00* (2006.01)
(52) U.S. Cl. ........................... 164/4.1; 164/155.1
(58) Field of Classification Search ............ 164/4.1, 164/155.1
See application file for complete search history.

(56) References Cited

U.S. PATENT DOCUMENTS

| | | | |
|---|---|---|---|
| 4,450,136 A | 5/1984 | Dudek et al. | 420/590 |
| 4,498,926 A | 2/1985 | Cline | 75/10.11 |
| 5,047,113 A | 9/1991 | Ostrogorsky | 156/616.1 |
| 5,527,877 A | 6/1996 | Dickens, Jr. et al. | 528/323 |
| 5,597,520 A | 1/1997 | Smalley et al. | 264/401 |
| 5,893,404 A * | 4/1999 | Mendez et al. | 164/71.1 |
| 5,980,812 A | 11/1999 | Lawton | 264/401 |
| 6,273,969 B1 | 8/2001 | Dutta et al. | 148/404 |
| 6,470,954 B2 * | 10/2002 | Kinane et al. | 164/46 |
| 6,723,278 B1 | 4/2004 | Lu et al. | 419/6 |
| 6,872,912 B1 | 3/2005 | Wos et al. | 219/121.64 |
| 2003/0173695 A1* | 9/2003 | Monkhouse et al. | 264/40.1 |
| 2004/0200404 A1 | 10/2004 | Brice | 117/4 |
| 2005/0112015 A1 | 5/2005 | Bampton | 416/5 |
| 2005/0133527 A1* | 6/2005 | Dullea et al. | 222/1 |
| 2006/0054079 A1 | 3/2006 | Withey et al. | 117/108 |
| 2010/0305742 A1* | 12/2010 | Twelves et al. | 700/112 |

FOREIGN PATENT DOCUMENTS

| | | |
|---|---|---|
| EP | 1 952 932 A2 | 8/2008 |
| JP | 09029480 | 2/1997 |
| JP | 10007496 A | 1/1998 |

* cited by examiner

*Primary Examiner* — Kuang Lin
(74) *Attorney, Agent, or Firm* — Harrington & Smith

(57) ABSTRACT

A method for forming an object, including providing at least a first material having a melting point at a first temperature and a second material having a melting point at a second temperature; heating at least a portion of the first and second materials above the first and second temperatures to form a substantially molten alloy, the molten alloy having a solidifying point at a third temperature, the third temperature being less than the first temperature and the second temperature; and providing substantially solid further material to at least a portion of the molten alloy, the further material having a melting point at a temperature greater than the third temperature.

16 Claims, 5 Drawing Sheets

METHOD FOR FORMING AN OBJECT

FIELD OF THE INVENTION

Embodiments of the present invention relate to a method, apparatus, computer readable storage medium and computer program for forming an object.

BACKGROUND TO THE INVENTION

Solid Freeform Fabrication (SFF) is a group of manufacturing technologies that are capable of producing 3D solid parts by a consecutive layer-wise shaping and consolidation of material (e.g. in the form of powder). Part geometric data can be taken directly from a Computer Aided Design (CAD) model and processed to form an object without the need for any moulds or tools. Various materials and combinations of materials such as plastics, waxes, metals and ceramics can be processed according to the process used.

The production of fully functional parts with high densities in a single step often requires the complete melting of powder particles. This can be achieved with the use of high energy densities (e.g. a laser beam or an electron beam) that can generate temperatures capable of fully liquefying powder particles creating a melt pool. Once the heat has been removed from the newly generated melt pool, the molten material solidifies forming a bulk mass often with the generation of new grains within its structure.

The above processes when applied to metal powders often induce a rapid melting and re-solidification of material that causes large internal thermal stresses that may cause a part to warp during and after solidification. Due to warping, certain geometries (such as overhanging/unsupported features which are relatively common in models), need to be forcibly held down to the substrate with anchors that are fabricated during a build. These anchors are usually made from the same metal used to produce the part and are often troublesome and time consuming or impossible to remove after producing the part. Removal of anchors can also damage components causing the part to be unusable.

It would therefore be desirable to provide an alternative method and apparatus for forming an object.

BRIEF DESCRIPTION OF VARIOUS EMBODIMENTS OF THE INVENTION

According to various, but not necessarily all, embodiments of the invention there is provided a method for forming an object, comprising: providing at least a first material having a melting point at a first temperature and a second material having a melting point at a second temperature; heating at least a portion of the first and second materials above the first and second temperatures to form a substantially molten alloy, the molten alloy having a solidifying point at a third temperature, the third temperature being less than the first temperature and the second temperature; and providing substantially solid further material to at least a portion of the molten alloy, the further material having a melting point at a temperature greater than the third temperature.

When the substantially solid further material is provided to at least a portion of the molten alloy, the substantially molten alloy may have a temperature above which the alloyed material does not substantially warp.

The method may further comprise heating at least a portion of the substantially solid further material above the temperature of the melting point of the further material.

The method may further comprise repeating the steps of providing further material and heating the further material to form an object.

The object may be substantially molten and the method may further comprise controlling cooling of the object to form a solidified object comprising a controlled micro structure. Controlling the cooling of the object may form a solidified object comprising a single crystal.

The method may further comprise controlling heating of the substantially molten alloy to maintain the temperature of the molten alloy above the third temperature and below the temperatures of the melting points of the first and second materials.

The method may further comprise detecting the temperature of the molten alloy and controlling the heating of the molten alloy using the detected temperature to maintain the temperature of the molten alloy above the third temperature and below the temperatures of the melting points of the first and second materials.

The method may further comprise heating the first material to a temperature below the first temperature prior to providing the first material and/or heating the second material to a temperature below the second temperature prior to providing the second material and/or heating the further material to a temperature below the melting point temperature of the further material.

The first material and the second material may be provided as a layer and the further material may be provided as a layer. The layers may be formed by sequential deposition of non mixed materials and/or deposition of mixed materials.

The first material, the second material and the further material may be provided as a powder.

The substantially solid further material may comprise at least the first material and the second material.

The first material and the second material may be provided in proportions that form a eutectic mixture and heating the first and second materials may form a substantially molten eutectic alloy.

The first material and the second material may be provided in proportions such that heating the first and second materials forms a substantially molten hyper eutectic alloy or a substantially molten hypo eutectic alloy.

According to various, but not necessarily all, embodiments of the invention there is provided apparatus for forming an object, comprising: a depositor comprising a first material having a melting point at a first temperature and a second material having a melting point at a second temperature, the depositor being configured to deposit at least the first material and the second material; a heater configured to heat at least a portion of the first and second materials above the first and second temperatures to form a substantially molten alloy, the molten alloy having a solidifying point at a third temperature, the third temperature being less than the first temperature and the second temperature; and wherein the depositor is configured to provide substantially solid further material to at least a portion of the molten alloy, the further material having a melting point at a temperature greater than the third temperature.

When the substantially solid further material is provided to at least a portion of the molten alloy, the substantially molten alloy may have a temperature above which the alloyed material does not substantially warp.

The heater may be configured to heat at least a portion of the substantially solid further material above the temperature of the melting point of the further material.

The apparatus may further comprise a controller configured to control cooling of an object produced by the apparatus to form a solidified object comprising a controlled micro structure. The controller may be configured to control cooling to form a solidified object comprising a single crystal.

The apparatus may further comprise a further heater configured to heat the substantially molten alloy to maintain the temperature of the molten alloy above the third temperature and below the temperatures of the melting points of the first and second materials.

The apparatus may further comprise a detector configured to detect the temperature of the molten alloy and a controller configured to control the heating of the molten alloy using the detected temperature to maintain the temperature of the molten alloy above the third temperature and below the temperatures of the melting points of the first and second materials.

The apparatus may further comprise another heater configured to heat the first material to a temperature below the first temperature prior to providing the first material, and/or heat the second material to a temperature below the second temperature prior to providing the second material and/or heat the further material to a temperature below the melting point temperature of the further material.

The depositor may be configured to provide the first material and the second material as a layer and may be configured to provide the further material as a layer. The layers may be formed by sequential deposition of non mixed materials or deposition of mixed materials.

The first material, the second material and the further material may be provided by the depositor as a powder.

The substantially solid further material may comprise the first material and the second material.

The first material and the second material may be provided in proportions that form a eutectic mixture and heating the first and second materials may form a substantially molten eutectic alloy.

The first material and the second material may be provided in proportions such that heating the first and second materials forms a substantially molten hyper eutectic alloy or a substantially molten hypo eutectic alloy.

According to various, but not necessarily all, embodiments of the invention there is provided a computer readable storage medium, encoded with instructions that when executed by a controller perform the method as described in any of the preceding paragraphs.

According to various, but not necessarily all, embodiments of the invention there is provided a computer program that, when executed by a controller, performs the method as described in any of the preceding paragraphs.

According to various, but not necessarily all, embodiments of the invention there is provided a method for forming an object, comprising: forming a substantially molten object by repeatedly depositing material and heating at least a portion of the material above the melting point of the material; and controlling cooling of the molten object to form a solidified object comprising a controlled micro structure.

Controlling cooling of the molten object may form a solidified object comprising a single crystal.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
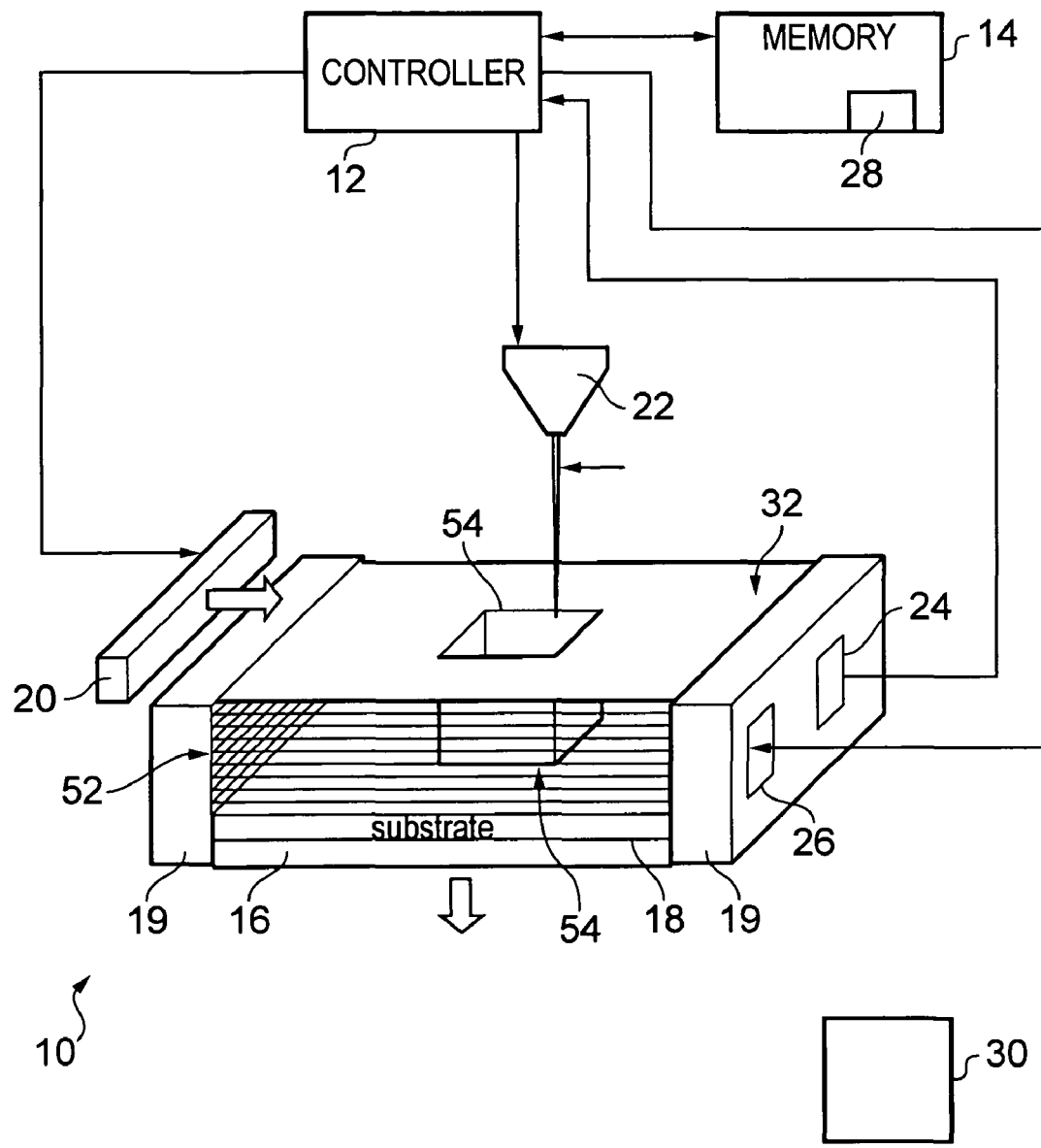
FIG. 1 illustrates a diagram of an apparatus according to various embodiments of the present invention.

FIG. 1 illustrates apparatus 10 for forming an object, comprising: a depositor 20 comprising a first material having a melting point at a first temperature and a second material having a melting point at a second temperature, the depositor 20 being configured to deposit at least the first material and the second material; a heater 22 configured to heat at least a portion of the first and second materials above the first and second temperatures to form a substantially molten alloy, the molten alloy having a solidifying point at a third temperature, the third temperature being less than the first temperature and the second temperature; and wherein the depositor 20 is configured to provide substantially solid further material to at least a portion of the molten alloy, the further material having a melting point at a temperature greater than the third temperature.

In the following description, the wording 'connect' and 'couple' and their derivatives mean operationally connected/coupled. It should be appreciated that any number or combination of intervening components can exist (including no intervening components).

FIG. 1 illustrates a diagram of an apparatus 10 for forming an object according to various embodiments of the invention. The apparatus 10 includes a controller 12, a memory 14, a support 16, a substrate 18, walls 19, a depositor 20, a first heater 22, a detector 24 and a second heater 26.

The implementation of the controller 12 can be in hardware alone (e.g. a circuit, a processor, etc), have certain aspects in software including firmware alone or can be a combination of hardware and software (including firmware). The controller 12 may be implemented using instructions that enable hardware functionality, for example, by using executable computer program instructions in a general-purpose or special-purpose processor that may be stored on a computer readable storage medium (disk, memory etc) to be executed by such a processor.

The controller 12 is configured to read from and write to the memory 14. The controller may also comprise an output interface via which data and/or commands are output by the controller 12 and an input interface via which data and/or commands are input to the controller 12.

The memory 14 may be any suitable memory and may be, for example, permanent built-in memory such as flash memory or it may be a removable memory such as a hard disk, secure digital (SD) card or a micro-drive. The memory 14 stores a computer program 28 comprising computer program instructions that control the operation of the apparatus 10 when loaded into the controller 12. The computer program instructions 28 provide the logic and routines that enables the apparatus 10 to perform at least some of the steps of the methods illustrated in FIGS. 2 and 5. The controller 12 by reading the memory 14 is able to load and execute the computer program 28.

The computer program may arrive at the apparatus 10 via any suitable delivery mechanism 30. The delivery mechanism 30 may be, for example, a computer-readable storage medium, a computer program product, a memory device, a record medium such as a Blue-ray disc, a CD-ROM, a DVD, or any article of manufacture that tangibly embodies the computer program 28. The delivery mechanism may be a signal configured to reliably transfer the computer program 28. The apparatus 10 may propagate or transmit the computer program 28 as a computer data signal.

Although the memory 14 is illustrated as a single component it may be implemented as one or more separate components some or all of which may be integrated/removable and/or may provide permanent/semi-permanent/dynamic/cached storage.

References to 'computer-readable storage medium', 'computer program product', 'tangibly embodied computer program' etc. or a 'controller', 'computer', 'processor' etc. should be understood to encompass not only computers having different architectures such as single /multi-processor architectures and sequential/parallel architectures but also specialized circuits such as field-programmable gate arrays (FPGA), application specific circuits (ASIC), signal processing devices and other devices. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

The support 16 has a substantially horizontal planar upper surface for supporting the substrate 18. The support 16 may have any suitable shape and may have, for example, a substantially rectangular cross section and a depth. The support 16 may comprise any suitable material that remains solid at relatively high temperatures (above seven hundred degrees Celsius for example) and may comprise a ceramic, for example. In various embodiments, the support 16 may be referred to as a processing table.

The substrate 18 is supported by the support 16 and is arranged to receive material from the depositor 20. The substrate 18 may have a similar shape to the support 16 and may have, for example, a substantially rectangular cross section and a depth. The substrate 18 may comprise any suitable material that remains solid at relatively high temperatures (above seven hundred degrees Celsius for example) and may comprise a ceramic, for example.

In various embodiments, the apparatus 10 may not include a substrate 18. In these embodiments, objects may be formed by first depositing a plurality of (n) layers which are not alloyed/joined and then on layer (n+1), the apparatus 10 commences the method illustrated in FIG. 2 and discussed in the following paragraphs.

The walls 19 are arranged around at least a part of the periphery of the support 16 and extend vertically from the support 16 and substrate 18. The walls 19 are arranged to prevent deposited material from falling from the substrate 18.

The support 16 is coupled to the walls 19 via a mechanism (not illustrated in the figure) that enables the support 16 to move vertically with respect to the walls 19. It should be appreciated from the above description that the support 16, the substrate 18 and the walls 19 form a container in which an object may be formed.

The depositor 20 comprises a storage member for storing material to be deposited and one or more apertures for allowing stored material to be deposited. The controller 12 may be configured to control the movement of the depositor 20 over the substrate 18 so that the depositor 20 may deposit material over at least a portion of the substrate 18. In other embodiments, the depositor 20 may be manually operated by a user of the apparatus 10. The depositor 20 may also be configured to level the surface of deposited material. For example, the depositor may comprise a blade that spreads material across the surface.

The first heater 22 is configured to provide heat to material deposited on the substrate 18. The first heater 22 may be any suitable heater for heating material over a desired temperature (six hundred degrees Celsius for example) and may be, for example, a laser, an electron emitter, an infra-red lamp or an inductance heater. The controller 12 may be configured to control the movement of the first heater 22 over the substrate 18 so that at least a portion of the deposited material is heated. For example, the controller 12 may read data (e.g. a computer aided design (CAD) file) from the memory 14 and use the data to control the first heater 22 so that the formed object represents the model in the CAD file. In other embodiments, the first heater 22 may be manually operated by a user of the apparatus 10.

The detector 24 is configured to detect the temperature of material deposited on the substrate 18 and provide the detected temperature to the controller 12 for processing. The detector 24 may be an electronic thermometer or a thermocouple or a pyrometer or an infra-red thermal imaging camera for example. In this embodiment, the detector 24 is illustrated as being positioned in one of the walls 19 of the apparatus 10. In other embodiments, the detector 24 may be located elsewhere (e.g. on the substrate 18, or above the material deposited) and in further embodiments, the apparatus 10 may comprise a plurality of detectors 24 that may be located in different positions on the apparatus 10 (e.g. on the walls 19 and on the substrate 18).

The second heater 26 is configured to provide heat to material deposited on the substrate 18 and may also heat the support 16 and/or the substrate 18 and/or the walls 19. The second heater 26 may be any suitable heater for maintaining the temperature of material deposited on the substrate 18 at a desired temperature. The controller 12 is configured to process the detected temperature received from the detector 24 and control the second heater 26 using the detected temperature. In this embodiment, the second heater 26 is illustrated as being positioned in one of the walls 19 of the apparatus 10. In other embodiments, the second heater 26 may be located elsewhere (e.g. on the substrate 18) and in further embodiments, the apparatus 10 may comprise a plurality of second heaters 26 that may be located in different positions on the apparatus 10 (e.g. on the walls 19 and on the substrate 18). In various embodiments, the second heater 26 may be manually operated by a user of the apparatus 10. The second heater may supply heat by radiation (e.g. using an infra-red heater above the materials deposited).

In various embodiments, the apparatus 10 may not include a second heater 26. In these embodiments, the material deposited on the substrate 18 may have a relatively low solidifying point temperature and may not require heating. Furthermore, the first heater 22 may be configured to provide the same functionality as the second heater 26 (i.e. to provide heat to material deposited on the substrate 18). For example, the first heater 22 may provide an electron beam that can be scanned quickly across the deposited material to maintain the temperature of the deposited material without joining/alloying the material. The deposited material may be scanned with different speed/power etc to join/alloy deposited material where required The operation of the apparatus 10 to form an object will now be described with reference to FIGS. 1, 2, 3 and 4.

At the start of the process (step 32), the apparatus 10 is arranged so that the support 16 is vertically positioned near the top of the walls 19. The depositor 20 provides at least a first material and a second material on the substrate 18 and levels the first material and the second material to be substantially flush with the top of the walls 19 (additional material is swept from the apparatus 10 by the depositor 20). As mentioned above, the apparatus 10 may not include a substrate 18 and may instead deposit a plurality of unalloyed layers of material initially, and then provide the first material and the second material on the plurality of layers.

In this embodiment, the first material is provided by the depositor 20 as a powder and the second material is provided by the depositor 20 as a powder. The first material and the second material may be pre-mixed and deposited together. Alternatively, the first material and the second material may be deposited sequentially so that the first material is deposited as a first layer and then the second material is deposited on the first layer to form a second layer. In other embodiments, the first and second materials may in a different form to powder (e.g. bulk or wire form).

It should be appreciated that any number of different materials may be deposited with the first and second materials in step 32. For example, step 32 may include depositing the first and second materials and additionally, third and fourth materials.

The selection of materials and the relative proportions of those materials for the first material and the second material are discussed in the following paragraphs with reference to FIGS. 3 and 4.

In general, the first and second materials are any materials that may be provided in proportions that form an alloy having a solidifying point temperature that is lower than the melting point temperature of the first material and the melting point temperature of the second material.

Figure 3:
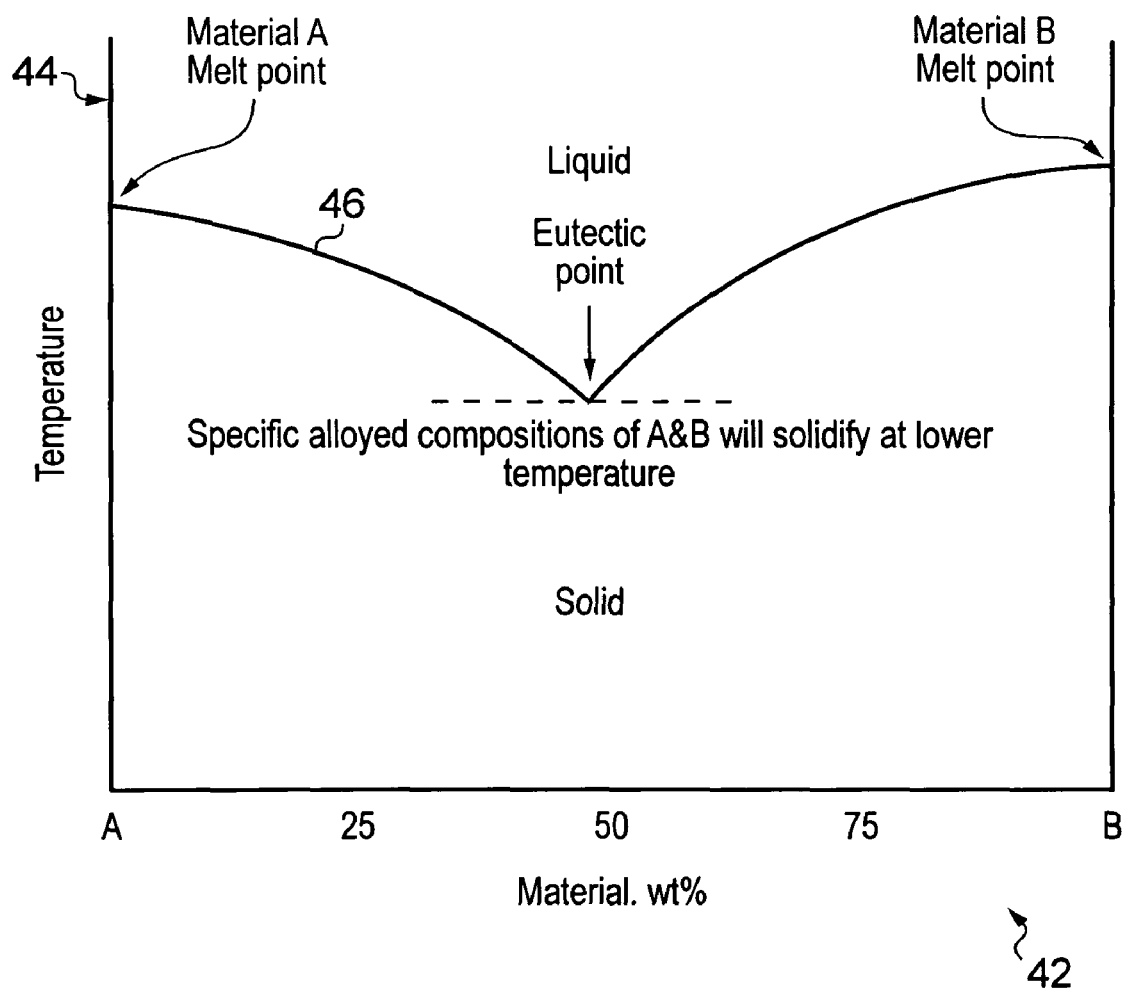
FIG. 3 illustrates a graph of the melting point temperatures of two different materials over a range of different proportions of the materials when they are alloyed.
Figure 4:
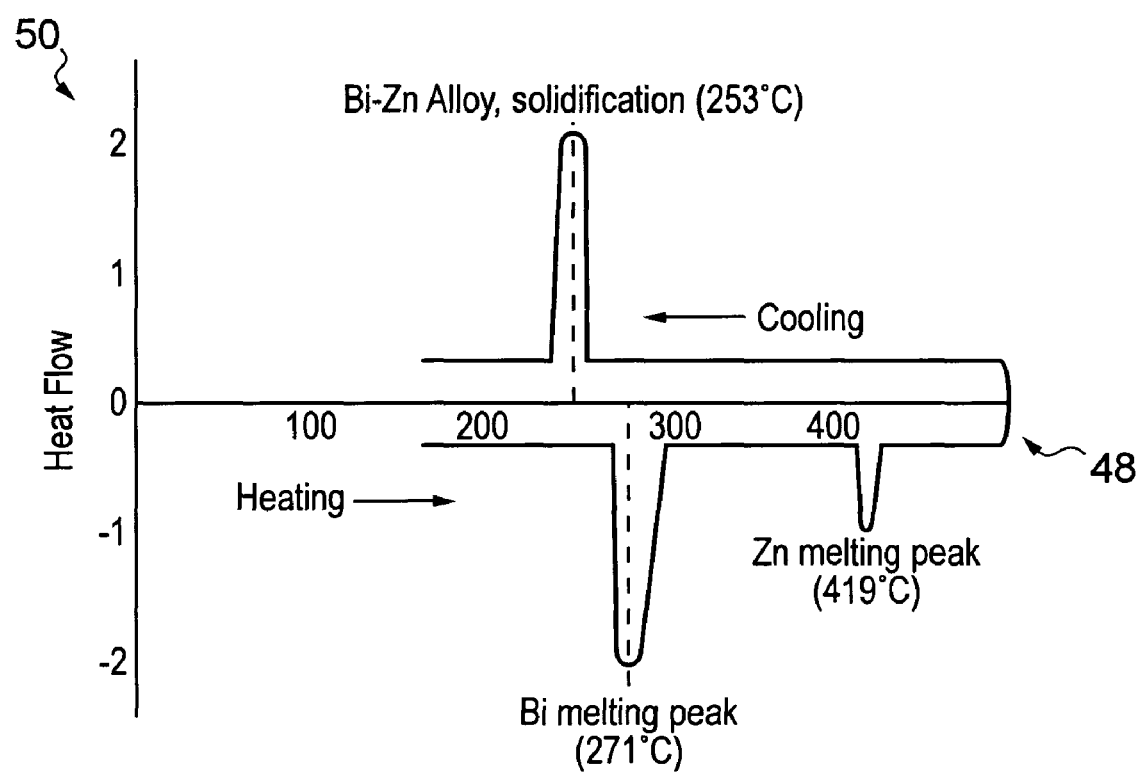
FIG. 4 illustrates a schematic illustrating the key points on a Differential Scanning calorimetry (DSC) graph indicating the melting point of Bi, Zn and the alloy of Bi—Zn.

FIG. 3 illustrates a graph having a horizontal (X) axis 42 for the proportions of the first material (labeled material A in the graph) and the second material (labeled material B in the graph) as a percentage of total alloyed material, a vertical (Y) axis 44 for the temperature of the first and second materials and a trace 46 that represents the solidifying point of the first and second material when they are alloyed in different proportions. FIG. 3 is essentially a phase diagram and line 46 is effectively the solidus. Temperatures above the line 46 represent material that is substantially liquid while temperatures below line 46 are not substantially liquid and may included states such as semi-liquid or solid.

The trace 46 commences at a first temperature that corresponds to the melting point/solidifying point of the first material only. The trace 46 has a negative gradient as the position along the X axis increases, until a particular material proportion (50% in this example) that forms a minima on the trace 46. The trace 46 then has a positive gradient as the position along the X axis increases and ends at a second temperature that corresponds to the melting point/solidifying point of the second material only.

It should be appreciated from FIG. 3 that the trace 46 has a minima (i.e. a lowest melting point/solidifying point of the alloyed first and second materials) at a particular proportion (50% in this example) of the first and second materials. This minima is usually referred to as a 'eutectic point' and such a combination of materials is usually referred to as a eutectic alloy. The eutectic point has a lower melting point/solidifying point temperature than the melting point temperature of the first material and the melting point temperature of the second material.

In one embodiment, the first material may be bismuth (ninety seven percent of the overall composition by weight) having a melting point at two hundred and seventy one degrees Celsius and the second material may be zinc (three percent of the overall composition) having a melting point at four hundred and nineteen degrees Celsius. FIG. 4 illustrates a schematic indicating the key points on a DSC graph of the melting points of these two materials and the eutectic alloy they subsequently form due to heating above four hundred and nineteen degrees Celsius. The schematic graph includes a horizontal (X) axis for temperature and a vertical (Y) axis for Heat Flow. The graph illustrates that upon heating, the bismuth melts at two hundred and seventy one degrees Celsius and that the zinc melts at four hundred and nineteen degrees Celsius. However, upon cooling, the eutectic bismuth-zinc alloy solidifies at two hundred and fifty three degrees Celsius.

In another embodiment, the first material may be aluminum (thirty two point three percent of the composition) having a melting point of six hundred and sixty degrees Celsius and the second material may be magnesium (sixty seven point seven percent of the composition) having a melting point of six hundred and forty nine degrees Celsius. Upon heating above six hundred and sixty degrees Celsius, the aluminum and magnesium form a eutectic aluminum-magnesium alloy with a solidifying point temperature of four hundred and thirty seven degrees Celsius.

It should also be appreciated from FIG. 3 that there is a range of proportions of the first and second materials where the solidifying point temperature of the alloyed first and second materials is lower than the melting point temperature of the first material and the melting point temperature of the second material. These compositions of the first and second material are usually referred to as hyper eutectic or hypo eutectic depending on whether each material in the composition is more or less than the specific eutectic alloy composition. In these embodiments, it should be understood that the solidifying point temperature of the alloyed first and second materials is the solidus of the formed alloy.

For example, an alloy of aluminum (sixty five percent of the composition) and magnesium (thirty five percent of the composition) forms a hypo eutectic alloy with a melting point of four hundred and fifty one degrees Celsius. It should be appreciated that the solidifying point temperature of this hypo eutectic alloy is less than the melting point temperature of both aluminum and magnesium.

Consequently, the first material and the second material may be any materials that are provided in proportions that form an alloy having a solidifying point temperature that is lower than the melting point temperature of the first material and the melting point temperature of the second material.

Returning to FIG. 2, at step 34 the controller 12 controls the first heater 22 to provide heat to at least a portion of the first and second materials deposited on the substrate 18. The first heater 22 heats the first and second materials above their respective melting point temperatures so that they melt and form a molten alloy. As described in detail above, the alloy has a lower solidifying point temperature than the melting point temperatures of the first material and the second material.

Where step 32 includes providing additional different material (e.g. a third material, a fourth material etc), it should be understood that at least some of the additional different material may have a melting point temperature that is lower than the solidifying point temperature of the alloyed first and second materials. For example, the first material may be aluminum, the second material may be magnesium and a third material provided in step 32 may be Lithium. Lithium has a melting point temperature of one hundred and eighty degrees Celsius which is lower than the lowest solidifying point temperature (approximately four hundred and fifty degrees Celsius, depending upon the proportions of materials) of the formed aluminum, magnesium, lithium alloy. The inventors appreciate that this will logically melt the lithium, but when the lithium is supplied in very small ratios this could still allow parts to be made and released from the surrounding material that has not been alloyed by the heater 22.

It should also be understood that at least some of the additional different material provided in step 32 may have a relatively high melting point temperature and may not melt when heat is provided in step 34.

At step 36, the controller 12 controls the depositor 20 to provide substantially solid further material over the substrate 18 and thereby to at least a portion of the molten alloy. The support 16 is also moved vertically downwards so that the substantially solid further material is flush with the walls 19 of the apparatus 10. The further material has a melting point temperature that is greater than the solidifying point temperature of the molten alloy. Consequently, the substantially solid further material remains a solid when deposited on the substantially molten alloy.

When the further material is provided to the substantially molten alloy, it should be appreciated that the substantially molten alloy may be liquid, semi-liquid, partially molten or partially solidified (e.g. the top surface of the molten alloy may form a solidified film). In various embodiments, the alloyed material should not cool to a temperature below which thermally induced stresses will cause sufficient warpage to cause the object to fail (e.g. for the alloyed material to curl up significantly/disruptively). Consequently, the substantially molten alloy should remain above a temperature at which it may warp significantly/disruptively.

Prior to being deposited on the molten alloy, the further material may be heated to a temperature that is less than the melting point temperature of the further material. This may provide an advantage in that the addition of the further material to the molten alloy may not substantially cool the molten alloy.

The further material may comprise the first material and/or the second material and may be a powder. In other embodiments, the substantially solid further material may comprise different material/materials to the first and second materials and may be in a different form to powder (e.g. bulk or wire form). In various embodiments, step 36 may include providing additional material(s) which is different to the further material. Where step 36 includes providing more than one material, the deposited material may be pre-mixed and provided in a layer or may be provided sequentially. The additional material(s) may have a melting point temperature that is lower than the solidifying point temperature of the molten alloy. The additional material(s) may have a relatively high melting point temperature and may remain solid during the formation of an object.

At step 38, the controller 12 controls the first heater 22 to provide heat to at least a portion of the substantially solid further material. The first heater 22 heats the substantially solid further material above the melting point temperature of the further material so that the further material melts. If the molten further material is positioned on top of the molten alloy formed in step 34, the molten further material joins the molten alloy.

Steps 36 and 38 are then repeated until a desired object is formed from the heated material. It should be appreciated that objects with relatively complex three dimensional shapes may be formed by heating and melting different areas of each successive layer of material without the need for anchors. As illustrated in FIG. 1, steps 32 to 38 may form a plurality of layers 52 of powdered material (usually referred to as a powder bed) and an object 54 on the substrate 18. The material surrounding the object 54 that has not been heated and melted remains as a powder. Once all layers of the object (s) have been alloyed by the first heater 22, it may be advantageous to deposit a plurality of layers on top of the part(s) prior to cooling and complete solidification of the part(s).

The apparatus 10 may additionally include a cooler (e.g. a fan) for cooling and solidifying the object 54. Once cooled and solidified, the object 54 may be removed from the substrate 18 (if attached to the substrate 18) and the remaining material in the plurality of layers 52 may be discarded or saved for forming a further object. In other embodiments, the object 54 may solidify at least in part during steps 32 to 38 and may not require cooling once the final layer of material is deposited.

Figure 5:
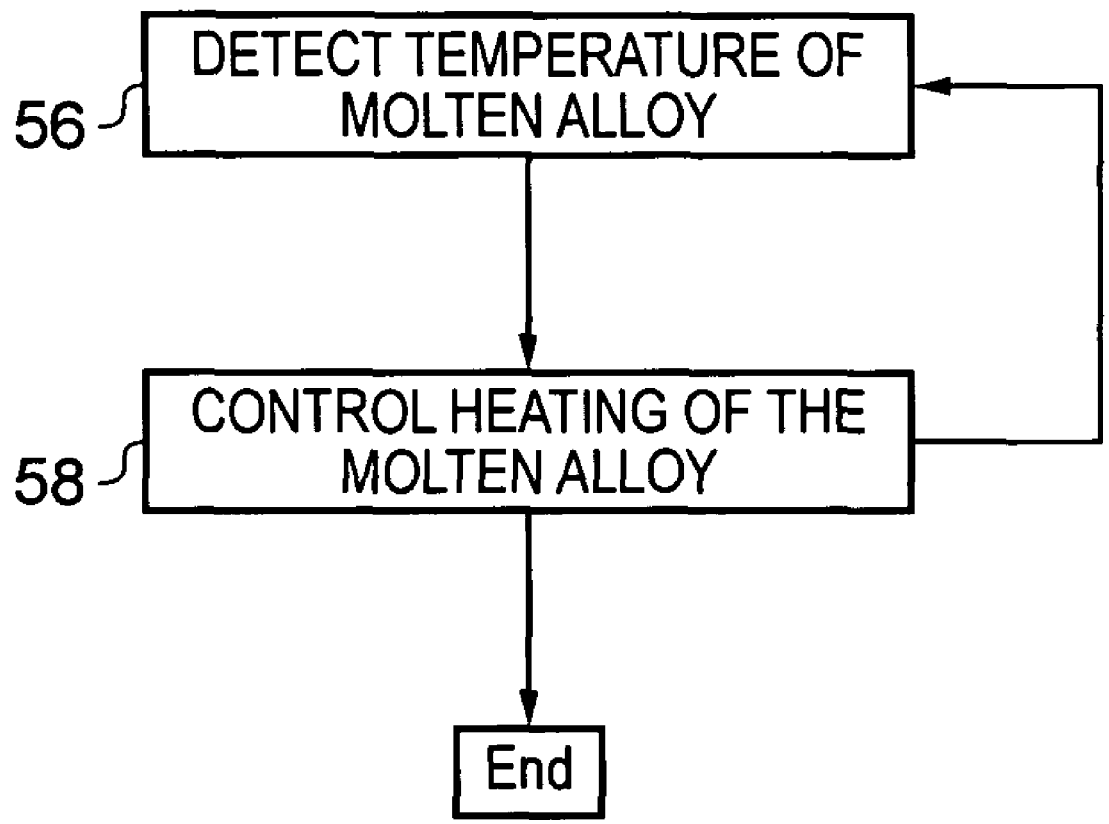
FIG. 5 illustrates a flow diagram of a method of controlling the temperature of a molten alloy according to various embodiments of the present invention.

In various embodiments of the present invention and as illustrated in FIG. 5, the controller 12 may receive the detected temperature of the molten alloy during steps 32, 34, 36 and 38 from the detector 24 (step 56). The controller may receive detected temperature from the un-molten material. The controller 12 may then control the second heater 26 to provide heat to the molten alloy to maintain the temperature of the molten alloy above the solidifying point temperature of the molten alloy but less than the melting point temperature of the further material (step 58). Steps 56 and 58 may be repeated until the object 54 is formed and ready for cooling.

The controller 12 may control the second heater 26 and the cooler so that the molten object 54 is directionally cooled and solidifies in a controlled direction from one end of the object to the other (e.g. from top to bottom). Directional cooling enables control of solidification/re-crystallization front, enables control over formation of grain structure, and control over grain structure may enable formation of desired grain structures (e.g. single crystal structures). Consequently, this form of directional cooling may enable the apparatus 10 to form objects 54 that comprise a single crystal (step 40). The formation of single crystal metals is known in the art of metallurgy and will consequently not be described in further detail here. Controlled cooling of the part(s) may also allow the formation of other structures that are not single crystals.

Embodiments of the present invention provide several advantages. One such advantage is that since the molten alloy has a lower melting point temperature, the solidification of the object 54 is delayed and a substantial thickness of material may be deposited before the object/partially completed object solidifies. This may help to reduce warping of the material upon solidification and result in the formed object better resembling the model in the CAD file. The operation of the detector 24 and the second heater 26 may assist in maintaining the object in a molten form until the object is completed.

Since warping of the material is reduced, it may not be necessary to include anchor structures in the model to forcible hold in place overhanging portions of the object. Consequently, embodiments of the present invention may reduce subsequent post-processing operations such as machining of the object to remove such support structures.

Figure 2:
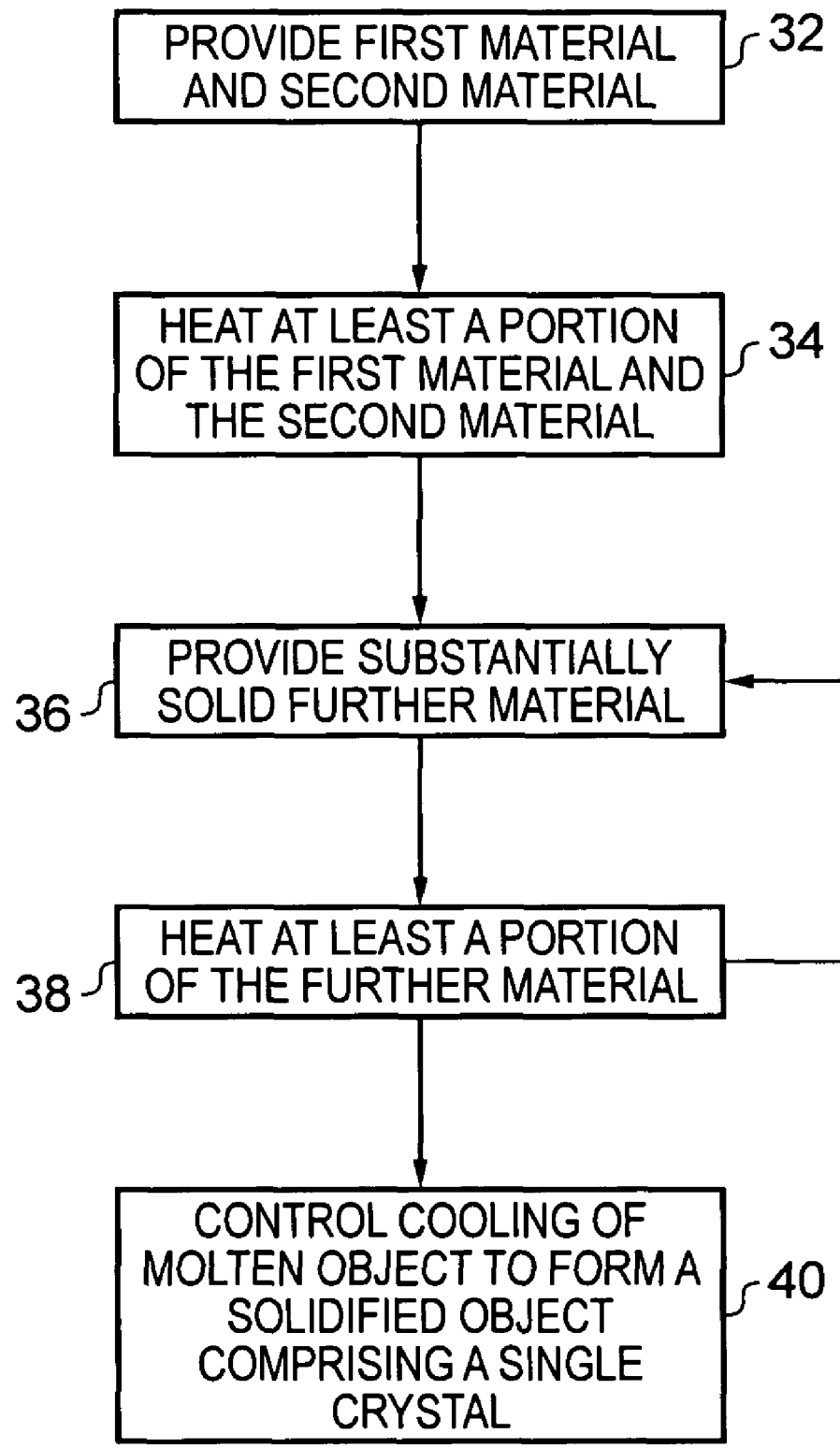
FIG. 2 illustrates a flow diagram of a method of forming an object according to various embodiments of the present invention.

The blocks illustrated in the FIGS. 2 and 5 may represent steps in a method and/or sections of code in the computer program 28. The illustration of a particular order to the blocks does not necessarily imply that there is a required or preferred order for the blocks and the order and arrangement of the block may be varied. Furthermore, it may be possible for some steps to be omitted.

Although embodiments of the present invention have been described in the preceding paragraphs with reference to various examples, it should be appreciated that modifications to the examples given can be made without departing from the scope of the invention as claimed. For example, more than two materials may be provided in steps 32 and 36 of FIG. 2 to form a eutectic/hyper eutectic/hypo eutectic alloy.

The first material may be an element (e.g. aluminum) or an alloy. The first material may be pure or may contain impurities. The second material may be an element (e.g. magnesium) or an alloy. The second material may be pure or may contain impurities. The further material may be an element (e.g. magnesium), a combination of materials (e.g. aluminum powder and magnesium powder) or an alloy. The second material may be pure or may contain impurities. The first material, second material and the further material may include metals, polymer, ceramic and/or organic components.

In various embodiments of the invention, the apparatus 10 may form a substantially molten object by repeatedly depositing material and heating at least a portion of the material above the melting point of the material. The material may comprise any metallic material and may not necessarily comprise a eutectic alloy, a hyper eutectic alloy or a hypo eutectic alloy. The apparatus 10 may be configured to control cooling of the molten object (e.g. by using a cooler such as a fan and a further heater as described above) to form a solidified object comprising a single crystal.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method for forming an object, comprising the steps of:
   first, providing at least a first material having a melting point at a first temperature and a second material having a melting point at a second temperature;
   second, heating a portion of the first and second materials above the first and second temperatures to form a substantially molten alloy, the molten alloy having a solidifying point at a third temperature, the third temperature being less than the first and second temperatures;
   third, cooling the molten alloy without solidification to temperature less than said first and second temperatures;
   fourth, providing, in a solid state, further material to contact at least a portion of the cooled molten alloy, the further material having a melting point at a temperature greater than the third temperature; and
   cooling and solidifying said molten alloy to form said object.

2. A method as claimed in claim 1, further comprising heating at least a portion of the further material above the temperature of the melting point of the further material.

3. A method as claimed in claim 2, further comprising repeating the steps of providing further material and heating the further material to form said object.

4. A method as claimed in claim 1, further comprising detecting the temperature of the molten alloy and controlling the heating of the molten alloy using the detected temperature to maintain the temperature of the molten alloy above the third temperature and below the temperatures of the melting points of the first and second materials.

5. A method as claimed in claim 1, further comprising heating the first material to a temperature below the first temperature prior to providing the first material and/or heating the second material to a temperature below the second temperature prior to providing the second material and/or heating the further material to a temperature below the melting point temperature of the further material.

6. A method as claimed in claim 1, wherein layers are formed by sequential deposition of non mixed said first, second and further materials and/or deposition of mixed said first, second and further materials.

7. A method as claimed in claim 1, wherein the first material, the second material and the further material are provided as a powder.

8. A method as claimed in claim 1, wherein the substantially solid further material comprises at least the first material and the second material.

9. A method as claimed in claim 1, wherein the first material and the second material are provided in proportions that form a eutectic mixture and heating the first and second materials forms a substantially molten eutectic alloy.

10. A method as claimed in claim 1, wherein first material and the second material are provided in proportions such that heating the first and second materials forms a substantially molten hyper eutectic alloy or a substantially molten hypo eutectic alloy.

11. A method as claimed in claim 3, further comprising:
    controlling cooling of the molten alloy to form said solidified object comprising a controlled micro structure.

12. A method as claimed in claim 11, wherein controlling cooling of the molten alloy forms a solidified object comprising a single crystal.

13. A method as claimed in claim 1, wherein the first material and the second material are provided as a layer and the further material is provided as a layer.

14. A method for forming an object, the method comprising the steps of:
   a) providing first substantially solid material, said substantially solid material comprising at least a first material and a second material, said first material having a first melting temperature and said second material having a second melting temperature;
   b) heating a portion of said first substantially solid material above the first and second melting temperatures to form a first portion of substantially molten alloy, said alloy having a solidifying temperature less than said first and second melting temperatures;
   c) cooling said portion below said first and second temperatures;
   d) retaining in a molten state said portion of molten alloy at a temperature below said first and second temperatures within confines defined by a remaining portion of said first solid material;
   e) providing further substantially solid material in contact with said first substantially solid material and said portion of molten alloy, said further substantially solid material comprising at least said first and second materials;

f) heating a portion of said further solid material above the first and second melting temperatures to form a further portion of substantially molten alloy at least partially in contact with said first portion of molten alloy;
g) cooling said further portion below said first and second temperatures;
h) retaining in a molten state at a temperature below said first and second temperatures said first portion and said further portion of molten alloy within confines defined by said remaining portion and a remaining portion of said further solid material; and
i) cooling said molten alloy below said solidifying temperature.

15. A method as claimed in claim 14 further comprising a plurality of repetitions of steps e) to h) before each portion of molten alloy is cooled in step i) to form said object.

16. A method as claimed in claim 14 wherein said cooling step forms said solidified object with a controlled micro structure.

* * * * *